(12) United States Patent
Chu

(10) Patent No.: US 11,011,713 B2
(45) Date of Patent: May 18, 2021

(54) DISPLAY MODULE AND ELECTRONIC APPARATUS

(71) Applicant: BOE Technology Group Co., Ltd., Beijing (CN)

(72) Inventor: Shangchieh Chu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 270 days.

(21) Appl. No.: 16/095,605

(22) PCT Filed: Jan. 9, 2018

(86) PCT No.: PCT/CN2018/071924
§ 371 (c)(1),
(2) Date: Oct. 22, 2018

(87) PCT Pub. No.: WO2018/209985
PCT Pub. Date: Nov. 22, 2018

(65) Prior Publication Data
US 2020/0251671 A1 Aug. 6, 2020

(30) Foreign Application Priority Data
May 17, 2017 (CN) .......................... 201710349199.2

(51) Int. Cl.
*H01L 51/52* (2006.01)
*H01L 27/32* (2006.01)
(Continued)

(52) U.S. Cl.
CPC ............ *H01L 51/0097* (2013.01); *B32B 7/12* (2013.01); *H01L 27/322* (2013.01);
(Continued)

(58) Field of Classification Search
CPC .............. H01L 51/0097; H01L 51/529; H01L 51/5237; H01L 27/322; H01L 27/3244; B32B 7/12
(Continued)

(56) References Cited

U.S. PATENT DOCUMENTS 9,757,923 B2 9/2017 Shin et al.
10,061,356 B2 8/2018 Jin et al.
(Continued)

FOREIGN PATENT DOCUMENTS

CN 202887620 U 4/2013
CN 204884440 U 12/2015
(Continued)

OTHER PUBLICATIONS

International Search Report and Written Opinion, including English translation of Box V of the Written Opinion, for International Application No. PCT/CN2018/071924, dated Apr. 4, 2018, 16 pages.
(Continued)

*Primary Examiner* — David Vu
*Assistant Examiner* — Brandon C Fox
(74) *Attorney, Agent, or Firm* — Westman, Champlin & Koehler, P.A.

(57) ABSTRACT

The present disclosure provides a display module and an electronic apparatus. The display module includes: a flexible substrate having: a first surface configured to form a displaying structure, and a second surface opposite to the first surface; and a protective part located on the second surface and having a supporting portion. The flexible substrate includes: a substrate body having a first subsurface which is a portion of the second surface corresponding to the substrate body; and a bent portion located at at least one side of the substrate body, bent towards the first subsurface of the
(Continued)

substrate body, and having a second subsurface which is a portion of the second surface corresponding to the bent portion. The second subsurface is supported by the supporting portion such that a radius of curvature of the bent portion : is not less than a minimal radius of curvature which the flexible substrate is capable of withstanding.

20 Claims, 3 Drawing Sheets

(51) Int. Cl.
    *H01L 51/00*     (2006.01)
    *B32B 7/12*     (2006.01)
(52) U.S. Cl.
    CPC ........ *H01L 27/3244* (2013.01); *H01L 51/529* (2013.01); *H01L 51/5237* (2013.01); *B32B 2457/20* (2013.01); *H01L 2251/5338* (2013.01)
(58) Field of Classification Search
    USPC .......................................................... 257/40
    See application file for complete search history.

(56) References Cited

U.S. PATENT DOCUMENTS

| | | |
|---|---|---|
| 2015/0091012 A1 | 4/2015 | Namkung et al. |
| 2015/0102298 A1 | 4/2015 | Namkung et al. |
| 2015/0313004 A1* | 10/2015 | Namkung ......... G02F 1/133308 |
| | | 361/749 |
| 2016/0136927 A1 | 5/2016 | Shin et al. |
| 2016/0218305 A1 | 7/2016 | Kim et al. |
| 2016/0343964 A1 | 11/2016 | Kwon |
| 2017/0215288 A1* | 7/2017 | Shi ......................... H05K 1/189 |
| 2017/0323779 A1* | 11/2017 | Um ..................... H01L 27/1262 |
| 2017/0373121 A1* | 12/2017 | Leng ................... H01L 27/3244 |
| 2018/0364758 A1 | 12/2018 | Jin et al. |
| 2019/0280248 A1* | 9/2019 | Kwon ................. H01L 51/5253 |
| 2020/0266368 A1* | 8/2020 | Park ...................... H01L 27/323 |

FOREIGN PATENT DOCUMENTS

| | | |
|---|---|---|
| CN | 205194238 U | 4/2016 |
| CN | 105609518 A | 5/2016 |
| CN | 205303466 U | 6/2016 |
| CN | 105826350 A | 8/2016 |
| CN | 105976718 A | 9/2016 |
| CN | 106301438 A | 1/2017 |
| CN | 106530973 A | 3/2017 |
| CN | 106940966 A | 7/2017 |

OTHER PUBLICATIONS

First Office Action, including Search Report, for Chinese Patent Application No. 201710349199.2, dated Oct. 12, 2018, 13 pages.

* cited by examiner

DISPLAY MODULE AND ELECTRONIC APPARATUS

CROSS-REFERENCE TO RELATED APPLICATION

This application is a Section 371 National Stage Application of International Applicaiton No. PCT/CN2018/071924, filed on 09 Jan. 2018, entitled "DISPLAY MODULE AND ELECTRONIC APPARATUS", which has not yet published, and claims priority to Chinese Patent Application No. 201710349199.2, filed with the State Intellectual Property Office of China on May 17, 2017, the disclosures of which are incorporated herein by reference in their entirety.

TECHNICAL FIELD

The present disclosure relates to a display module and an electronic apparatus.

BACKGROUND

In order to achieve a narrow-frame or frameless display device, generally it is necessary to bend a flexible display panel. However, a bent portion of the flexible display panel must maintain a certain radius of curvature. Otherwise the flexible display panel will be damaged.

SUMMARY

Embodiments of the present disclosure provide a display module comprising: a flexible substrate having: a first surface configured to form a displaying structure, and a second surface opposite to the first surface; and a protective part located on the second surface of the flexible substrate and having a supporting portion, wherein the flexible substrate comprises: a substrate body having a first subsurface which is a portion of the second surface of the flexible substrate corresponding to the substrate body; and a bent portion located at at least one side of the substrate body, bent towards the first subsurface of the substrate body, and having a second subsurface which is a portion of the second surface of the flexible substrate corresponding to the bent portion, and wherein the second subsurface is supported by the supporting portion of the protective part such that a radius of curvature of the bent portion of the flexible substrate is not less than a minimal radius of curvature which the flexible substrate is capable of withstanding when it is bent.

According to embodiments of the present disclosure, the supporting portion of the protective part has a supporting curved surface, and the second subsurface of the bent portion of the flexible substrate is supported by the supporting curved surface of the supporting portion of the protective part.

According to embodiments of the present disclosure, the supporting curved surface of the supporting portion of the protective part comprises an arc-shaped surface.

According to embodiments of the present disclosure, the supporting portion of the protective part comprises an arc-shaped part which has an arc-shaped surface serving as the supporting curved surface of the protective part.

According to embodiments of the present disclosure, the second subsurface of the bent portion of the flexible substrate fits in with the supporting curved surface of the supporting portion of the protective part.

According to embodiments of the present disclosure, a radius of curvature of the arc-shaped surface of the supporting portion of the protective part is not less than the minimal radius of curvature which the flexible substrate is capable of withstanding when it is bent.

According to embodiments of the present disclosure, a minimal radius of curvature of the supporting curved surface of the supporting portion of the protective part is not less than the minimal radius of curvature which the flexible substrate is capable of withstanding when it is bent.

According to embodiments of the present disclosure, the protective part is a protective film which covers at least a portion of the second surface of the flexible substrate and which comprises a protective film body and the supporting portion located at at least one side of the protective film body.

According to embodiments of the present disclosure, the protective part is a protective film which covers at least a portion of the second surface of the flexible substrate and which comprises a protective film body and the arc-shaped part located at at least one side of the protective film body.

According to embodiments of the present disclosure, the protective part is a protective film comprising: a first surface; a second surface opposite to the first surface of the protective film; a protective film body covering at least a portion of the first subsurface of the substrate body of the flexible substrate, wherein the protective film body has: a first subsurface which is a portion of the first surface of the protective film corresponding to the protective film body, and which faces towards the substrate body of the flexible substrate; and a second subsurface which is a portion of the second surface of the protective film corresponding to the protective film body; and a first back folded segment disposed on at least one side of the protective film body, the first back folded segment is connected to the protective film body and is folded back towards the first subsurface of the substrate body of the flexible substrate so as to form the supporting portion, and the first back folded segment has a third subsurface which is a portion of the second surface of the protective film corresponding to the first back folded segment and which faces towards the second subsurface of the protective film body.

According to embodiments of the present disclosure, the third subsurface of the first back folded segment fits in with the second subsurface of the protective film body.

According to embodiments of the present disclosure, the protective part is a protective film comprising: a first surface; a second surface opposite to the first surface of the protective film; a protective film body covering at least a portion of the first subsurface of the substrate body of the flexible substrate, wherein the protective film body has: a first subsurface which is a portion of the first surface of the protective film corresponding to the protective film body, and which faces towards the substrate body of the flexible substrate; and a second subsurface which is a portion of the second surface of the protective film corresponding to the protective film body; and second and third back folded segments disposed on at least one side of the protective film body, the second back folded segment is connected between the protective film body and the third back folded segment, and the second back folded segment and the third back folded segment are folded back towards the first subsurface of the substrate body of the flexible substrate so as to form the supporting portion, the second back folded segment has a third subsurface which is a portion of the second surface of the protective film corresponding to the second back folded segment, the third back folded segment has: a fourth subsurface which is a portion of the first surface of the protective film corresponding to the third back folded segment; and a fifth subsurface which is a portion of the second surface of the protective film corresponding to the third back folded segment, wherein the fifth subsurface of the third back folded segment faces towards the third subsurface of the second back folded segment, and the fourth subsurface of the third back folded segment faces towards the second subsurface of the protective film body.

According to embodiments of the present disclosure, the fifth subsurface of the third back folded segment fits in with the third subsurface of the second back folded segment, and the fourth subsurface of the third back folded segment fits in with the second subsurface of the protective film body.

According to embodiments of the present disclosure, the protective film comprises: a first adhesion layer covering at least a portion of the first subsurface of the substrate body of the flexible substrate; and a buffer layer disposed on a surface of the first adhesion layer facing away from the substrate body.

According to embodiments of the present disclosure, the protective film further comprises: a first heat dissipation layer disposed on a surface of the buffer layer facing away from the substrate body; and a second adhesion layer disposed on a surface of the first heat dissipation layer facing away from the buffer layer.

According to embodiments of the present disclosure, the protective part is a protective film comprising: a first surface; a second surface opposite to the first surface of the protective film; a protective film body covering at least a portion of the first subsurface of the substrate body of the flexible substrate, wherein the protective film body has: a first subsurface which is a portion of the first surface of the protective film corresponding to the protective film body, and which faces towards the substrate body of the flexible substrate; and a second subsurface which is a portion of the second surface of the protective film corresponding to the protective film body; and a first back folded segment disposed on at least one side of the protective film body, the first back folded segment is connected to the protective film body and is folded back towards the first subsurface of the substrate body of the flexible substrate so as to form the supporting portion, and the first back folded segment has a third subsurface which is a portion of the second surface of the protective film corresponding to the first back folded segment; and the display module further comprises a layer disposed on the second subsurface of the protective film body; and the third subsurface of the first back folded segment faces towards a surface of the layer facing away from the protective film body of the protective film.

According to embodiments of the present disclosure, the third subsurface of the first back folded segment fits in with the surface of the layer facing away from the protective film body of the protective film.

According to embodiments of the present disclosure, the protective part is a protective film comprising: a first surface; a second surface opposite to the first surface of the protective film; a protective film body covering at least a portion of the first subsurface of the substrate body of the flexible substrate, wherein the protective film body has: a first subsurface which is a portion of the first surface of the protective film corresponding to the protective film body, and which faces towards the substrate body of the flexible substrate; and a second subsurface which is a portion of the second surface of the protective film corresponding to the protective film body; and second and third back folded segments disposed on at least one side of the protective film body, the second back folded segment is connected between the protective film body and the third back folded segment, and the second back folded segment and the third back folded segment are folded back towards the first subsurface of the substrate body of the flexible substrate so as to form the supporting portion, the second back folded segment has a third subsurface which is a portion of the second surface of the protective film corresponding to the second back folded segment, the third back folded segment has: a fourth subsurface which is a portion of the first surface of the protective film corresponding to the third back folded segment; and a fifth subsurface which is a portion of the second surface of the protective film corresponding to the third back folded segment, and the display module further comprises a layer disposed on the second subsurface of the protective film body; and the fifth subsurface of the third back folded segment faces towards the third subsurface of the second back folded segment, and the fourth subsurface of the third back folded segment faces towards a surface of the layer facing away from the protective film body of the protective film.

According to embodiments of the present disclosure, the fifth subsurface of the third back folded segment fits in with the third subsurface of the second back folded segment, and the fourth subsurface of the third back folded segment fits in with the surface of the layer facing away from the protective film body of the protective film.

According to embodiments of the present disclosure, the layer comprises: a second heat dissipation layer disposed on the second subsurface of the protective film body; and a third adhesion layer disposed on a surface of the second heat dissipation layer facing away from the protective film body.

According to embodiments of the present disclosure, the display module further comprises: a protective cover plate disposed on a sixth subsurface of the substrate body of the flexible substrate, wherein the sixth subsurface is a portion of the first surface of the flexible substrate corresponding to the substrate body; and a support frame disposed on a side of the protective part facing away from the substrate body.

According to embodiments of the present disclosure, the flexible substrate is a flexible display panel having a display screen, and the displaying structure is the display screen.

Embodiments of the present disclosure provide an electronic apparatus comprising the above display module.

DETAILED DESCRIPTION

Figure 1:
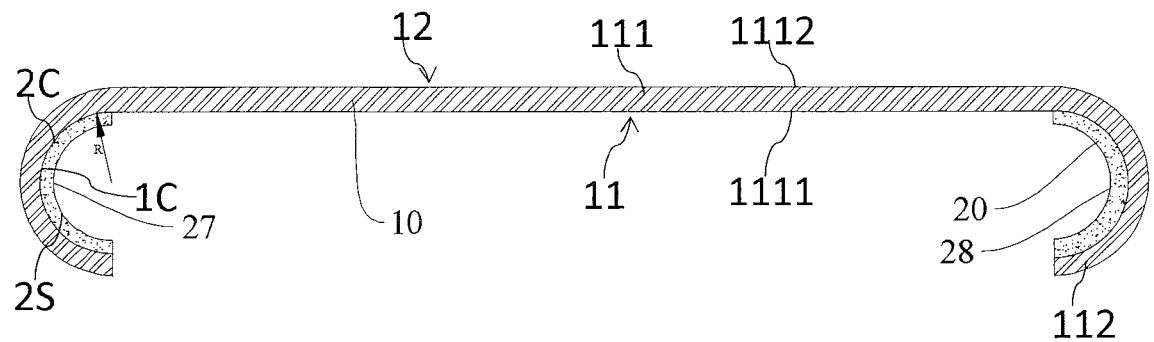
FIG. 1 is a schematic diagram showing a structure of a display module according to an embodiment of the present disclosure.
Figure 2:
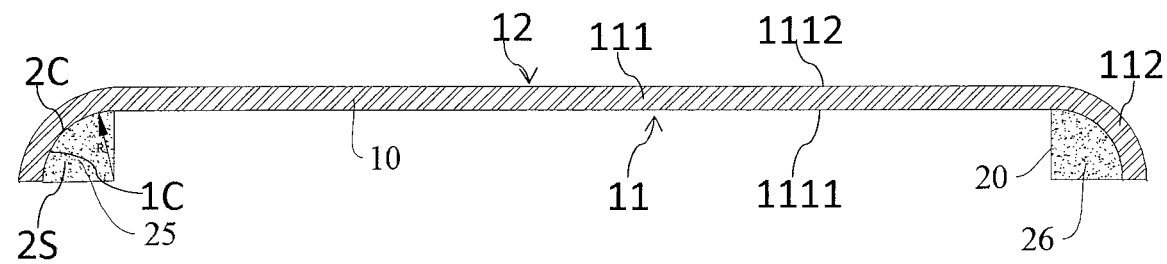
FIG. 2 is a schematic diagram showing a structure of a display module according to another embodiment of the present disclosure.

Embodiments of the present disclosure will be described as follows in detail. The embodiments described below are illustrative, are only used to explain the present invention, and should not be construed as limiting the present invention.

Embodiments of the present disclosure provide a display module. As shown in FIGS. 1-9, the display module includes: a flexible substrate 10 having: a first surface 12 configured to form a displaying structure, and a second surface 11 opposite to the first surface 12; and a protective part 20 located on the second surface 11 of the flexible substrate 10 and having a supporting portion 2S. The flexible substrate 10 includes: a substrate body 111 having a first subsurface 1111 which is a portion of the second surface 11 of the flexible substrate 10 corresponding to the substrate body 111; and a bent portion 112 located at at least one side of the substrate body 111, bent towards the first subsurface 1111 of the substrate body 111, and having a second subsurface 1C which is a portion of the second surface 11 of the flexible substrate 10 corresponding to the bent portion 112. The second subsurface 1C is supported by the supporting portion 2S of the protective part 20 such that a radius of curvature R of the bent portion 112 of the flexible substrate 10 is not less than a minimal radius of curvature which the flexible substrate 10 is capable of withstanding when it is bent.

According to an embodiment of the present invention, the flexible substrate 10 may be a flexible display panel 10 having a display screen, and the displaying structure is the display screen. The flexible substrate 10 may also be a flexible base substrate with no other element, an array substrate having a flexible base substrate and pixel units disposed on the flexible base substrate, a color filter substrate having a flexible base substrate and a color filter disposed on the flexible base substrate, or the like.

The minimal radius of curvature R which the flexible substrate 10 is capable of withstanding when it is bent relates to a modulus of elasticity of a material of the flexible substrate 10, a thickness of the flexible substrate 10, and the like. For example, the more the modulus of elasticity of the material of the flexible substrate 10 is, the less the minimal radius of curvature which the flexible substrate 10 is capable of withstanding is, i.e. the more a bendable degree of the flexible substrate 10 is; and the less the thickness of the flexible substrate 10 is, the less the minimal radius of curvature which the flexible substrate 10 is capable of withstanding is, i.e. the more the bendable degree of the flexible substrate 10 is. Furthermore, if the flexible substrate 10 is a multilayer flexible substrate, the more the modulus of elasticity of a material of an outermost layer of the flexible substrate is, the less the minimal radius of curvature which the flexible substrate 10 is capable of withstanding is, i.e. the more the bendable degree of the flexible substrate 10 is.

According to an embodiment of the present disclosure, as shown in FIGS. 1-9, the supporting portion 2S of the protective part 20 has a supporting curved surface 2C, and the second subsurface 1C of the bent portion 112 of the flexible substrate 10 is supported by the supporting curved surface 2C of the supporting portion 2S of the protective part 20. A minimal radius of curvature of the supporting curved surface 2C of the supporting portion 2S of the protective part 20 is not less than the minimal radius of curvature which the flexible substrate is capable of withstanding when it is bent. According to an embodiment of the present invention, the supporting curved surface 2C of the supporting portion 2S of the protective part 20 may include an arc-shaped surface. For example, as shown in FIGS. 1 and 4-9, the supporting portion 2S of the protective part 20 includes an arc-shaped part which has an arc-shaped surface serving as the supporting curved surface 2C of the protective part 20. A radius of curvature of the arc-shaped surface of the supporting portion 2S of the protective part 20 is not less than the minimal radius of curvature which the flexible substrate 10 is capable of withstanding when it is bent.

According to an embodiment of the present disclosure, as shown in FIGS. 1-9, the second subsurface 1C of the bent portion 112 of the flexible substrate 10 fits in with the supporting curved surface 2C of the supporting portion 2S of the protective part 20. Of course, the second subsurface 1C of the bent portion 112 of the flexible substrate 10 may be in at least partial contact with the supporting curved surface 2C of the supporting portion 2S of the protective part 20.

According to an embodiment of the present disclosure, as shown in FIGS. 1-9, the protective part 20 is a protective film 20 which covers at least a portion of the second surface 11 of the flexible substrate 10 and which includes a protective film body 24 and the supporting portion 2S located at at least one side of the protective film body 24. According to an example of the present disclosure, as shown in FIGS. 1-9, the protective part 20 is a protective film 20 which covers at least a portion of the second surface 11 of the flexible substrate 10. The protective film 20 includes a protective film body 24 and the arc-shaped part located at at least one side of the protective film body 24 and serving as the supporting portion 2S.

An example of the embodiments of the present disclosure provides a display module. According to the example of the embodiments of the present disclosure, referring to FIG. 1, the display module includes: a flexible display panel 10; and a protective part 20 located on a back surface of the flexible display panel 10 and including an arc-shaped portion. For example, at least a portion of the protective part 20 is formed in an arc shape. The flexible display panel 10 includes a bent portion located at at least one side, bent towards the back surface, and fitting in with the arc-shaped portion of the protective part 20. For example, at least one side of the flexible display panel 10 is bent towards the back surface, and fits in with the arc-shaped portion of the protective part 20, such that a radius of curvature R of the bent portion of the flexible display panel 10 is not less than a minimal radius of curvature which the flexible display panel 10 is capable of withstanding when it is bent. Thereby, the protective part can effectively ensures that a radius of curvature of the flexible display panel when it is bent will not exceed the minimal radius of curvature which the flexible display panel is capable of withstanding, guaranteeing that the flexible display panel will not be damaged, increasing an up-to-standard rate, and also achieving a narrow-frame design effect.

It should be noted that the term "a/the front surface of the flexible display panel", as used herein, means a surface on which a picture and information are displayed by the flexible display panel, while the term "a/the back surface of the flexible display panel", as used herein, means a surface opposite to the front surface of the flexible display panel. Herein a front surface of each of other structures and components refers to a surface facing towards the flexible display panel, while a back surface of each of the other structures and components refers to a surface facing away from the flexible display panel.

According to the embodiments of the present disclosure, there is no particular limitation on a specific type of the flexible display panel so long as flexibility and displaying requirements can be satisfied. Those skilled in the art can flexibly make a selection according to requirements. For example, the flexible display panel includes, but not limited to, an organic light-emitting diode (OLED) display panel, a liquid crystal display (LCD) display panel, and the like.

According to the embodiments of the present disclosure, there is no particular limitation on which side of the flexible display panel needs to be bent. Those skilled in the art can flexibly make a selection according to actual design requirements. In some embodiments of the present disclosure, generally, two opposite sides of the flexible display panel are bent to achieve a narrow-frame display panel. In all of the drawings, the display module is illustrated in detail by taking as an example the case where two opposite sides of the flexible display panel are bent. Of course, it can be appreciated by those skilled in the art that the case is only intended to illustrate the display module according to the present disclosure, and should not be construed as limiting the present invention.

According to the embodiments of the present disclosure, there is no particular limitation on specific structure, shape, and disposing manner of the protective part so long as at least a portion of the protective part is formed in an arc shape or the protective part includes an arc-shaped portion, such that a portion of the flexible display panel which needs to be bent towards the back surface can fit in with the arc-shaped portion of the protective part. In some embodiments of the present disclosure, referring to FIG. 1, the protective part 20 may include a first arc-shaped structure 27 and a second arc-shaped structure 28 which are each formed in an arc shape, and which are disposed on the back surface of the flexible display panel at two opposite sides of the flexible display panel, respectively. In some embodiments of the present disclosure, referring to FIG. 2, the protective part 20 may include a first blocky structure 25 and a second blocky structure 26. The first blocky structure 25 and the second blocky structure 26 are each formed in a blocky shape, and are disposed on the back surface of the flexible display panel at two opposite sides of the flexible display panel, respectively. In addition, the first blocky structure 25 and the second blocky structure 26 each have a surface which is in contact with the flexible display panel and which is formed in an arc shape. In other embodiments of the present disclosure, referring to FIG. 3, the protective part 20 is formed in a plate shape, is disposed on at least a portion of the back surface of the flexible display panel, and has two opposite ends each formed in an arc shape. In addition, the plate-shaped protective part may cover a portion of the back surface or the whole back surface of the flexible display panel. Thereby, in each case, the protective part can well protect the flexible display panel from being damaged, and increase an up-to-standard rate. In addition, the protective part is applicable to various situations. According to embodiments of the present disclosure, in order to better protect the flexible display panel from being damaged due to an excessive bend when it is bent, a radius of curvature of the arc-shaped portion of the protective part may be not less than a minimal radius of curvature which the flexible display panel is capable of withstanding when it is bent. Thereby, it can be ensured that the radius of curvature of the flexible display panel when it is bent will be not less than the minimal radius of curvature which the flexible display panel is capable of withstanding when it is bent. The protective part can effectively guarantees that the flexible display panel will not be damaged, increasing an up-to-standard rate.

Figure 3:
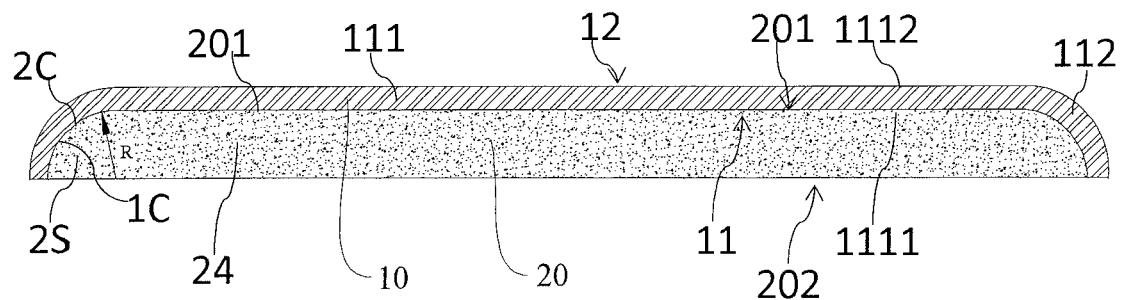
FIG. 3 is a schematic diagram showing a structure of a display module according to still another embodiment of the present disclosure.

According to some specific embodiments of the present disclosure, referring to FIG. 3, the protective part 20 is a protective film 20 which covers at least a portion of the back surface of the flexible display panel 10 and which includes the arc-shaped part located at at least one side. For example, at least one side of the protective film 20 is formed in an arc shape. Thereby, the protective film can better provide the flexible display panel with a support while protecting the flexible display panel, and can achieve a narrow-frame design concept.

Figure 4:
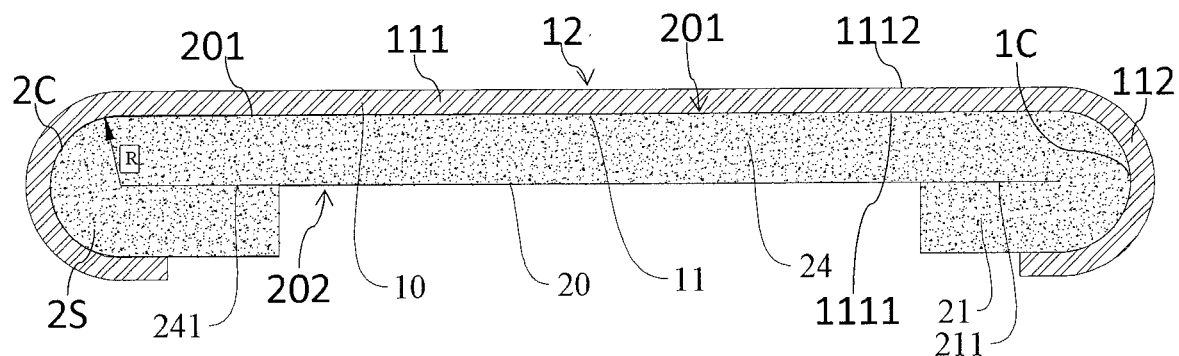
FIG. 4 is a schematic diagram showing a structure of a display module according to yet another embodiment of the present disclosure.

According to an embodiment of the present disclosure, as shown in FIG. 4, the protective part 20 is a protective film 20. The protective film 20 includes: a first surface 201; a second surface 202 opposite to the first surface 201 of the protective film 20; a protective film body 24 covering at least a portion of the first subsurface 1111 of the substrate body 111 of the flexible substrate 10. The protective film body 24 has: a first subsurface 2011 which is a portion of the first surface 201 of the protective film 20 corresponding to the protective film body 24, and which faces towards the substrate body 111 of the flexible substrate 10; and a second subsurface 241 which is a portion of the second surface 202 of the protective film 20 corresponding to the protective film body 24; and a first back folded segment 21 disposed on at least one side of the protective film body 24. The first back folded segment 21 is connected to the protective film body 24 and is folded back towards the first subsurface 1111 of the substrate body 111 of the flexible substrate 10 so as to form the supporting portion 2S, and the first back folded segment 21 has a third subsurface 211 which is a portion of the second surface 202 of the protective film 20 corresponding to the first back folded segment 21 and which faces towards the second subsurface 241 of the protective film body 24. According to an example of the present disclosure, the third subsurface 211 of the first back folded segment 21 may fit in with the second subsurface 241 of the protective film body 24. Of course, the third subsurface 211 of the first back folded segment 21 may be in at least partial contact with the second subsurface 241 of the protective film body 24.

According to an example of the embodiments of the present disclosure, in order that a thickness of the display module is not excessively increased while it is ensured that the radius of curvature of the circular portion of the protective film is big enough, the arc-shaped portion may be formed by folding back the protective film 20. In some embodiments of the present disclosure, referring to FIG. 4, the protective film 20 includes: a body 24 covering at least a portion of the back surface of the flexible display panel; and a first back folded segment 21 disposed on at least one side of the body 24. The first back folded segment 21 is connected to the body 24 and is folded back towards the back surface 11 of the flexible display panel 10 such that a front surface 211 of the first back folded segment 21 fits in with a back surface 241 of the body 24. Thereby, a radius of curvature of an arc-shaped portion of the flexible display panel is increased by folding back the protective film once, so that the flexible display panel is prevented from being damaged due to a too small radius of curvature of the arc-shaped portion when it is bent, and the protective film will not have an excessively large thickness to increase the thickness of the display module.

Figure 5:
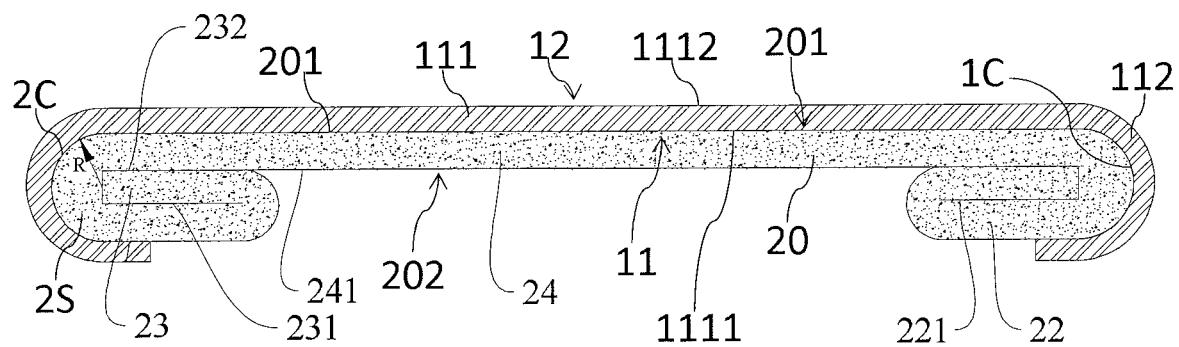
FIG. 5 is a schematic diagram showing a structure of a display module according to a further embodiment of the present disclosure.

According to an embodiment of the present disclosure, as shown in FIG. 5, the protective part 20 is a protective film 20. The protective film 20 includes: a first surface 201; a second surface 202 opposite to the first surface 201 of the protective film 20; a protective film body 24 covering at least a portion of the first subsurface 1111 of the substrate body 111 of the flexible substrate 10. The protective film body 24 has: a first subsurface 2011 which is a portion of the first surface 201 of the protective film 20 corresponding to the protective film body 24, and which faces towards the substrate body 111 of the flexible substrate 10; and a second subsurface 241 which is a portion of the second surface 202 of the protective film 20 corresponding to the protective film body 24; and second and third back folded segments 22 and 23 disposed on at least one side of the protective film body 24. The second back folded segment 22 is connected between the protective film body 24 and the third back folded segment 23, and the second back folded segment 22 and the third back folded segment 23 are folded back towards the first subsurface 1111 of the substrate body 111 of the flexible substrate 10 so as to form the supporting portion 2S. The second back folded segment 22 has a third subsurface 221 which is a portion of the second surface 202 of the protective film 20 corresponding to the second back folded segment 22. The third back folded segment 23 has: a fourth subsurface 232 which is a portion of the first surface 201 of the protective film 20 corresponding to the third back folded segment 23; and a fifth subsurface 231 which is a portion of the second surface 202 of the protective film 20 corresponding to the third back folded segment 23, and the fifth subsurface 231 of the third back folded segment 23 faces towards the third subsurface 221 of the second back folded segment 22, and the fourth subsurface 232 of the third back folded segment 23 faces towards the second subsurface 241 of the protective film body 24. According to an example of the present disclosure, the fifth subsurface 231 of the third back folded segment 23 fits in with the third subsurface 221 of the second back folded segment 22, and the fourth subsurface 232 of the third back folded segment 23 fits in with the second subsurface 241 of the protective film body 24. According to another example of the present disclosure, the fifth subsurface 231 of the third back folded segment 23 is in at least partial contact with the third subsurface 221 of the second back folded segment 22, and the fourth subsurface 232 of the third back folded segment 23 is in at least partial contact with the second subsurface 241 of the protective film body 24.

According to an example of the embodiments of the present disclosure, in order to further decrease the thickness of the display module while the radius of curvature of the arc-shaped portion of the protective film is increased, the arc-shaped portion may be formed by folding back the protective film twice. Specifically, referring to FIG. 5, the protective film 20 includes: a body 24 covering at least a portion of the back surface of the flexible display panel; and second and third back folded segments 22 and 23 disposed on at least one side of the body 24. The second back folded segment 22 is connected between the body 24 and the third back folded segment 23, and the second back folded segment 22 and the third back folded segment 23 are folded back towards the back surface of the flexible display panel, so that a back surface 231 of the third back folded segment 23 fits in with a front surface 221 of the second back folded segment 22, and a front surface 232 of the third back folded segment 23 fits in with a back surface 241 of the body 24. Thereby, the radius of curvature of the arc-shaped portion of the protective film is further increased by folding back the protective film twice, and thus the radius of curvature of the arc-shaped portion of the flexible display panel is further increased. As a result, the flexible display panel is prevented from being damaged while the thickness of the protective film is decreased, conforming to lightening and thinning development trend.

According to the embodiments of the present disclosure, the number of times of folding back the protective film is not limited to the above two cases, and may be flexibly selected by those skilled in the art according to actual conditions. For example, the protective film is folded back three times, four times or even more times. The number of times will be no longer described herein for the sake of brevity.

Figure 6:
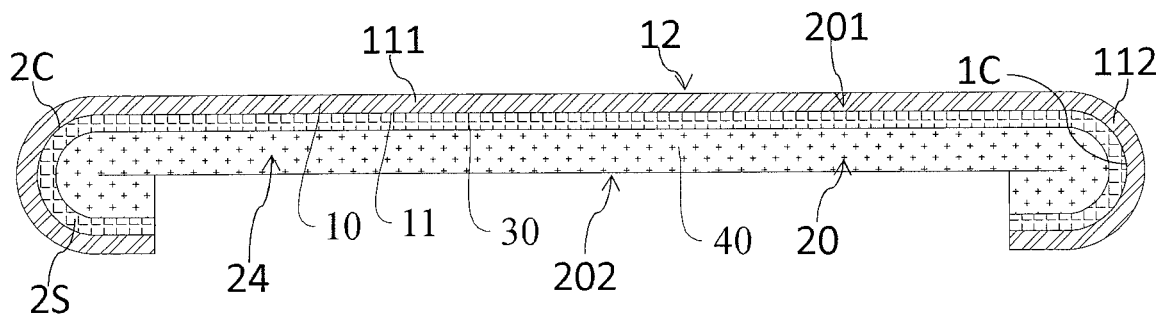
FIG. 6 is a schematic diagram showing a structure of a display module according to a still further embodiment of the present disclosure.
Figure 7:
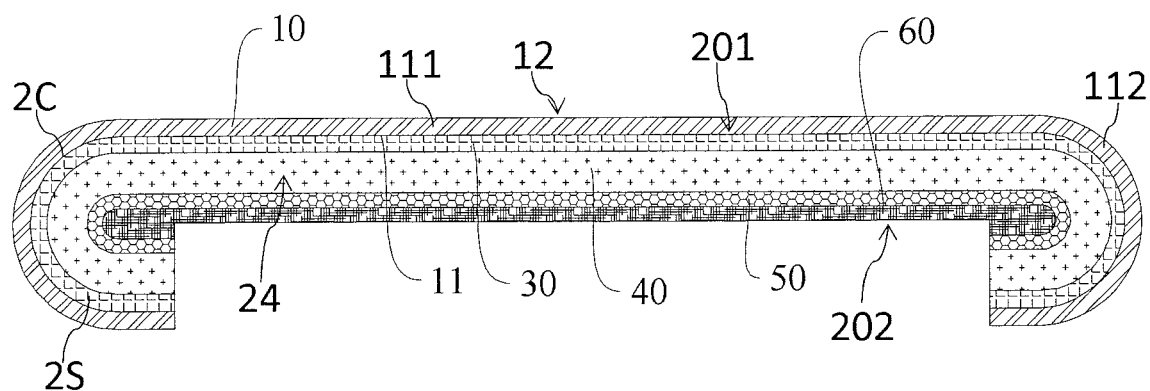
FIG. 7 is a schematic diagram showing a structure of a display module according to a yet further embodiment of the present disclosure.

According to an embodiment of the present disclosure, as shown in FIGS. 6-7, the protective film 20 includes: a first adhesion layer 30 covering at least a portion of the first subsurface 1111 of the substrate body 111 of the flexible substrate 10; and a buffer layer 40 disposed on a surface of the first adhesion layer 30 facing away from the substrate body 111. For example, referring to FIG. 6, the protective film 20 includes: a first adhesion layer 30 covering at least a portion of the back surface 11 of the flexible display panel 10; and a buffer layer 40 disposed on a back surface of the first adhesion layer 30. Thereby, the protective film can play both adhesion and buffer roles.

According to the embodiments of the present disclosure, a specific type of the first adhesion layer is not limited by particular conditions so long as the flexible display panel and the buffer layer can securely adhere to each other through the first adhesion layer. In some embodiments of the present disclosure, the specific type of the first adhesion layer includes, but not limited to, a textured adhesive tape, a double-side adhesive tape, and an adhesive copper foil tape. There is also no particular requirement on a method of forming the first adhesion layer, and the method includes, but not limited to, methods such as coating, depositing and the like.

According to the embodiments of the present disclosure, there is no particular limitation on a material of which the buffer layer is formed, and the material may be flexibly selected by those skilled in the art according to actual conditions. In some embodiments of the present disclosure, the material of which the buffer layer is formed includes, but not limited to, a buffer foam. There is also no particular requirement on a method of forming the buffer layer, and the method includes, but not limited to, methods such as coating, depositing and the like.

According to an embodiment of the present disclosure, as shown in FIG. 7, the protective film 20 further includes: a first heat dissipation layer 50 disposed on a surface of the buffer layer 40 facing away from the substrate body 111; and a second adhesion layer 60 disposed on a surface of the first heat dissipation layer 50 facing away from the buffer layer 40. For example, referring to FIG. 7, the protective film 20 further includes: a first heat dissipation layer 50 disposed on a back surface of the buffer layer 40; and a second adhesion layer 60 disposed on a back surface of the first heat dissipation layer 50. Thereby, the protective film may also have a heat dissipation function, while the flexible display panel and another component can adhere to each other through the second adhesion layer.

According to the embodiments of the present disclosure, there is no particular limitation on a material of which the first heat dissipation layer is formed so long as the material can play a heat dissipation role, and the material may be flexibly selected by those skilled in the art according to actual conditions. In some embodiments of the present disclosure, the material of which the first heat dissipation layer is formed includes, but not limited to, a graphite heat dissipation sheet. There is also no particular requirement on a method of forming the first heat dissipation layer, and the method includes, but not limited to, methods such as coating, depositing and the like.

According to the embodiments of the present disclosure, a specific type of the second adhesion layer is not limited by particular conditions, and may be flexibly selected by those skilled in the art according to requirements. In some embodiments of the present disclosure, the specific type of the second adhesion layer includes, but not limited to, a textured adhesive tape, a double-side adhesive tape, and an adhesive copper foil tape. There is also no particular requirement on a method of forming the second adhesion layer, and the method includes, but not limited to, methods such as coating, depositing and the like.

Figure 8:
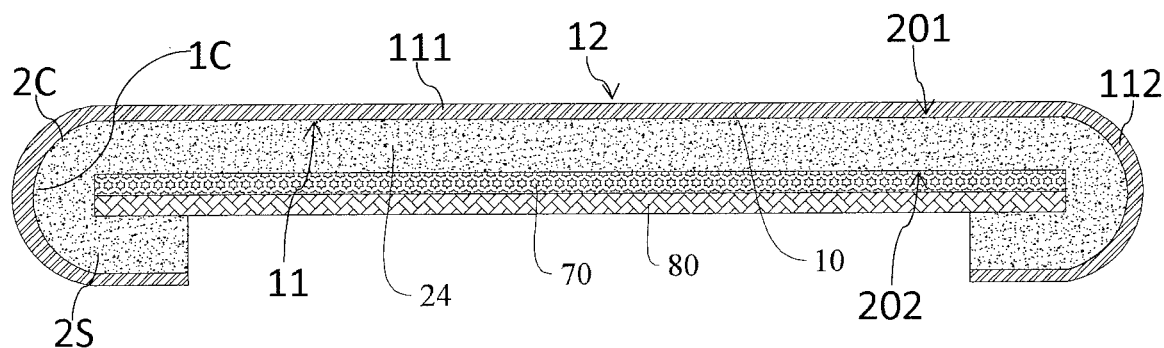
FIG. 8 is a schematic diagram showing a structure of a display module according to another embodiment of the present disclosure.

According to embodiments of the present disclosure, referring to FIGS. 4 and 8, the protective part 20 is a protective film 20. The protective film 20 includes: a first surface 201; a second surface 202 opposite to the first surface 201 of the protective film 20; a protective film body 24 covering at least a portion of the first subsurface 1111 of the substrate body 111 of the flexible substrate 10. The protective film body 24 has: a first subsurface 2011 which is a portion of the first surface 201 of the protective film 20 corresponding to the protective film body 24, and which faces towards the substrate body 111 of the flexible substrate 10; and a second subsurface 241 which is a portion of the second surface 202 of the protective film 20 corresponding to the protective film body 24; and a first back folded segment 21 disposed at at least one side of the protective film body 24. The first back folded segment 21 is connected to the protective film body 24 and is folded back towards the first subsurface 1111 of the substrate body 111 of the flexible substrate 10 so as to form the supporting portion 2S, and the first back folded segment 21 has a third subsurface 211 which is a portion of the second surface 202 of the protective film 20 corresponding to the first back folded segment 21. The display module further includes a layer disposed on the second subsurface 241 of the protective film body 24; and the third subsurface 211 of the first back folded segment 21 faces towards a surface of the layer facing away from the protective film body 24 of the protective film 20. According to an example of the present disclosure, the third subsurface 211 of the first back folded segment 21 fits in with the surface of the layer facing away from the protective film body 24 of the protective film 20. According to another example of the present disclosure, the third subsurface 211 of the first back folded segment 21 is in at least partial contact with the surface of the layer facing away from the protective film body 24 of the protective film 20. Referring to FIGS. 5 and 8, the protective part 20 is a protective film 20. The protective film 20 includes: a first surface 201; a second surface 202 opposite to the first surface 201 of the protective film 20; a protective film body 24 covering at least a portion of the first subsurface 1111 of the substrate body 111 of the flexible substrate 10. The protective film body 24 has: a first subsurface 2011 which is a portion of the first surface 201 of the protective film 20 corresponding to the protective film body 24, and which faces towards the substrate body 111 of the flexible substrate 10; and a second subsurface 241 which is a portion of the second surface 202 of the protective film 20 corresponding to the protective film body 24; and second and third back folded segments 22 and 23 disposed on at least one side of the protective film body 24. The second back folded segment 22 is connected between the protective film body 24 and the third back folded segment 23, and the second back folded segment 22 and the third back folded segment 23 are folded back towards the first subsurface 1111 of the substrate body 111 of the flexible substrate 10 so as to form the supporting portion 2S. The second back folded segment 22 has a third subsurface 221 which is a portion of the second surface 202 of the protective film 20 corresponding to the second back folded segment 22. The third back folded segment 23 has: a fourth subsurface 232 which is a portion of the first surface 201 of the protective film 20 corresponding to the third back folded segment 23; and a fifth subsurface 231 which is a portion of the second surface 202 of the protective film 20 corresponding to the third back folded segment 23. The display module further includes a layer disposed on the second subsurface 241 of the protective film body 24; and the fifth subsurface 231 of the third back folded segment 23 faces towards the third subsurface 221 of the second back folded segment 22, and the fourth subsurface 232 of the third back folded segment 23 faces towards a surface of the layer facing away from the protective film body 24 of the protective film 20. According to an example of the present disclosure, the fifth subsurface 231 of the third back folded segment 23 fits in with the third subsurface 221 of the second back folded segment 22, and the fourth subsurface 232 of the third back folded segment 23 fits in with the surface of the layer facing away from the protective film body 24 of the protective film 20. According to another example of the present invention, the fifth subsurface 231 of the third back folded segment 23 is in at least partial contact with the third subsurface 221 of the second back folded segment 22, and the fourth subsurface 232 of the third back folded segment 23 is in at least partial contact with the surface of the layer facing away from the protective film body 24 of the protective film 20. According to an embodiment of the present invention, as shown in FIG. 8, the layer includes: a second heat dissipation layer 70 disposed on the second subsurface 241 of the protective film body 24; and a third adhesion layer 80 disposed on a surface of the second heat dissipation layer 70 facing away from the protective film body 24.

According to an example of the embodiments of the present disclosure, in the case where an arc-shaped structure is formed by folding back the protective film, another functional layer may be disposed on a back surface of the protective film body. In some embodiments of the present disclosure, referring to FIG. 8, the display module further includes: a second heat dissipation layer 70 disposed on the back surface of the body 24; and a third adhesion layer 80 disposed on a back surface of the second heat dissipation layer 70. Thereby, the display module may have heat dissipation and adhesion functions. Referring to FIGS. 4 and 8, the protective film 20 further includes a first back folded segment 21 disposed on at least one side of the body 24. The first back folded segment 21 is connected to the body 24 and is folded back towards the back surface 11 of the flexible display panel 10 such that a front surface of the first back folded segment 21 fits in with a back surface of the third adhesion layer 80. Referring to FIGS. 5 and 8, the protective film 20 further includes second and third back folded segments 22 and 23 disposed on at least one side of the body 24. The second back folded segment 22 is connected between the body 24 and the third back folded segment 23, and the second back folded segment 22 and the third back folded segment 23 are folded back towards the back surface of the flexible display panel, so that a back surface 231 of the third back folded segment 23 fits in with a front surface 221 of the second back folded segment 22, and a front surface 232 of the third back folded segment 23 fits in with a back surface of the third adhesion layer 80. Furthermore, the display module may have any appropriate layer disposed on the back surface 11 of the flexible display panel 10, and the layer may be constituted by the second heat dissipation layer 70 and the third adhesion layer 80 as shown in FIG. 8, or one or more other layers.

According to the embodiments of the present disclosure, there is no particular limitation on a material of which the second heat dissipation layer is formed so long as the material can play a heat dissipation role, and the material may be flexibly selected by those skilled in the art according to actual conditions. In some embodiments of the present disclosure, the material of which the second heat dissipation layer is formed includes, but not limited to, a graphite heat dissipation sheet. There is also no particular requirement on a method of forming the second heat dissipation layer, and the method includes, but not limited to, methods such as coating, depositing and the like.

According to the embodiments of the present disclosure, a specific type of the third adhesion layer is not limited by particular conditions, and may be flexibly selected by those skilled in the art according to requirements. In some embodiments of the present disclosure, the specific type of the third adhesion layer includes, but not limited to, a textured adhesive tape, a double-side adhesive tape, and an adhesive copper foil tape. There is also no particular requirement on a method of forming the third adhesion layer, and the method includes, but not limited to, methods such as coating, depositing and the like.

Figure 9:
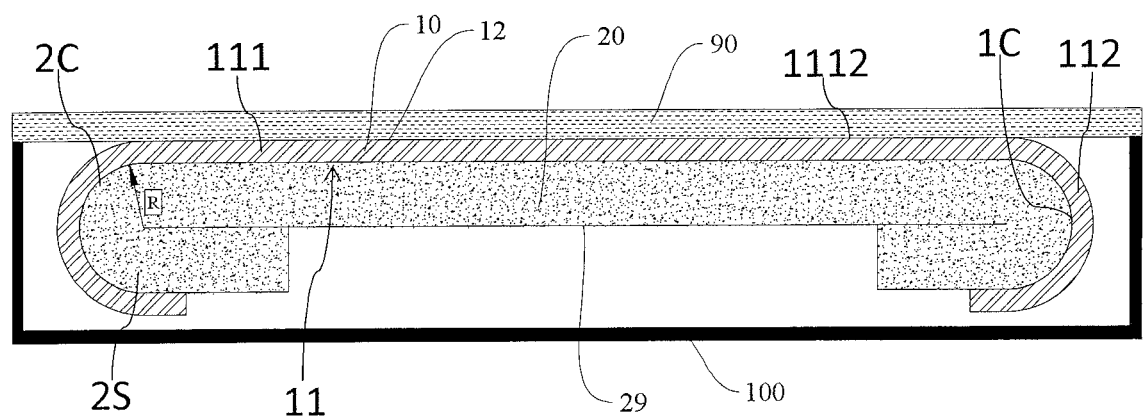
FIG. 9 is a schematic diagram showing a structure of a display module according to still another embodiment of the present disclosure.

According to an embodiment of the present disclosure, as shown in FIG. 9, the display module further includes: a protective cover plate 90 disposed on a sixth subsurface 1112 of the substrate body 111 of the flexible substrate 10, the sixth subsurface 1112 being a portion of the first surface 12 of the flexible substrate 10 corresponding to the substrate body 111; and a support frame 100 disposed on a side of the protective part 20 facing away from the substrate body 111. For example, referring to FIG. 9, the display module may further include: a protective cover plate 90 disposed on the front surface 12 of the flexible display panel 10; and a support frame 100 disposed on a back surface of the protective part 20. Thereby, they can provide the display module with good protecting and supporting effects, prolonging service life of the display module.

According to the embodiments of the present disclosure, there is no particular limitation on a material of which the protective cover plate is formed, and the material may be flexibly selected by those skilled in the art according to actual conditions. In some embodiments of the present disclosure, the material of which the protective cover plate is formed includes, but not limited to, a glass cover plate, a metal cover plate, a polymer cover plate, and the like.

According to the embodiments of the present disclosure, there is no particular limitation on a material of which the support frame is formed, and the material may be flexibly selected by those skilled in the art according to actual conditions. In some embodiments of the present disclosure, the material of which the support frame is formed includes, but not limited to, metal, polymer, and the like.

In another aspect of the present disclosure, the present disclosure provides an electronic apparatus. According to an embodiment of the present disclosure, the electronic apparatus includes the above display module. Thereby, the electronic apparatus has a good displaying quality and a relatively small width of a frame in a non-display area. It could be appreciated by those skilled in the art that the electronic apparatus has all of the features and advantages of the above display module, which are no longer described one by one herein for the sake of brevity.

According to the embodiments of the present disclosure, there is no particular limitation on the specific type of the electronic apparatus. The electronic apparatus may include any device and apparatus having a display module in the field. For example, the electronic apparatus includes, but not limited to, a mobile phone, a tablet computer, a computer display, a game machine, a television, a display screen, a wearable device, and other living appliances or household appliances with display screens, and the like.

Of course, it could be appreciated by those skilled in the art that the electronic apparatus according to the present disclosure may include necessary structures and components possessed by conventional electronic devices, in addition to the above display module. A description will be made by taking a mobile phone as an example. The mobile phone may have structures and components possessed by conventional mobile telephones, such as a touch screen, a housing, a CPU, a camera module, a fingerprint identification module, a sound processing system, and the like, in addition to the display module according to the present disclosure.

Moreover, the terms "first" and "second" are used for only descriptive purposes and should not to be construed as indicating or implying a relative importance or implicitly indicating the numbers of technical features indicated by them. Thus, a feature defined with the term "first" or "second" may include one or more of the features either explicitly or implicitly. In the description of the present disclosure, "a/the plurality of" means two or more unless otherwise explicitly and specifically defined.

In the description of the present specification, the description with reference to the term "an embodiment", "some embodiments", "an example", "specific example", "some examples" or the like means that a specific feature, structure, material or characteristic described in conjunction with the embodiment or example is included in at least one embodiment or example of the present disclosure. In the present specification, the illustrative references to the above terms are not necessarily directed to the same embodiment or example. Furthermore the described specific features, structures, materials or characteristics may be combined in appropriate manners in any one or more embodiments or examples. In addition, those skilled in the art could combine the different embodiments or examples and the features of the different embodiments or examples described in the description unless they conflict.

While the embodiments of the present disclosure have been shown and described above, it will be appreciated that the above embodiments are illustrative and should not be construed as limiting the prevent invention. Those skilled in the art may make changes, modifications, substitutions and alterations to the above embodiments within the scope of the invention.

What is claimed is:
1. A display module comprising:
   a flexible substrate having: a first surface configured to form a displaying structure, and a second surface opposite to the first surface; and
   a protective part located on the second surface of the flexible substrate and having a supporting portion, wherein the flexible substrate comprises:
a substrate body having a first subsurface which is a portion of the second surface of the flexible substrate corresponding to the substrate body; and
a bent portion located at at least one side of the substrate body, bent towards the first subsurface of the substrate body, and having a second subsurface which is a portion of the second surface of the flexible substrate corresponding to the bent portion,
wherein the second subsurface is supported by the supporting portion of the protective part such that a radius of curvature of the bent portion of the flexible substrate is not less than a minimal radius of curvature which the flexible substrate is capable of withstanding when it is bent,
wherein the protective part is a protective film comprising:
a first surface;
a second surface opposite to the first surface of the protective film;
a protective film body covering at least a portion of the first subsurface of the substrate body of the flexible substrate, wherein the protective film body has; a first subsurface which is a portion of the first surface of the protective film corresponding to the protective film body, and which face towards the substrate body of the flexible substrate; and a second subsurface which is a portion of the second surface of the protective film corresponding to the protective film body; and
second and third back folded segments disposed on at least one side of the protective film body, and
wherein the second back folded segement is connected between the protective film body and the third back folded segment, and the second back folded segment and the third back folded segment are folded back towards the first subsurface of the substrate body of the flexible substrate so as to form the supporting portion, the second back folded segment has a third subsurface which is a portion of the second surface of the protective film corresponding to the second back folded segment, the third back folded segment has: a fourth subsurface which is a portion of the first surface of the protective film corresponding to the third back folded segment; and a fift subsurface which is a portion of the second surface of the protective film corresponding to the third back folded segment, wherein the fifth subsurface of the third back folded segment faces towards the third subsurface of the second back folded segment, and the fourth subsurface of the third back folded segment faces towards the second subsurface of the protective film body.

2. The display module of claim 1, wherein:
the supporting portion of the protective part has a supporting curved surface, and the second subsurface of the bent portion of the flexible substrate is supported by the supporting curved surface of the supporting portion of the protective part.

3. The display module of claim 2, wherein:
the supporting curved surface of the supporting portion of the protective part comprises an arc-shaped surface.

4. The display module of claim 2, wherein:
the supporting portion of the protective part comprises an arc-shaped part which has an arc-shaped surface serving as the supporting curved surface of the protective part.

5. The display module of claim 2, wherein:
the second subsurface of the bent portion of the flexible substrate fits in with the supporting curved surface of the supporting portion of the protective part.

6. The display module of claim 1, wherein:
the fifth subsurface of the third back folded segment fits in with the third subsurface of the second back folded segment, and the fourth subsurface of the third back folded segment fits in with the second subsurface of the protective film body.

7. The display module of claim wherein:
the protective film comprises:
a first adhesion layer covering at least a portion of the first subsurface of the substrate body of the flexible substrate; and
a buffer layer disposed on a surface of the first adhesion layer facing away from the substrate body.

8. The display module of claim 7, wherein:
the protective film further comprises:
a first heat dissipation layer disposed on a surface of the buffer layer facing away from the substrate body; and
a second adhesion layer disposed on a surface of the first heat dissipation layer facing away from the buffer layer.

9. The display module of claim 1, further comprising:
a protective cover plate disposed on a sixth subsurface of the substrate body of the flexible substrate, wherein the sixth subsurface is a portion of the first surface of the flexible substrate corresponding to the substrate body; and
a support frame disposed on a side of the protective part facing away from the substrate body.

10. An electronic apparatus comprising: the display module of claim 1.

11. A display module comprising:
a flexible substrate having: a first surface configured to form a displaying structure, and a second surface opposite to the first surface; and
a protective part located on the second surface of the flexible substrate and having a supporting portion,
wherein the flexible substrate comprises:
a substrate body having a first subsurface which is a portion of the second surface of the flexible substrate corresponding to the substrate body; and
a bent portion located at at least one side of the substrate body, bent towards the first subsurface of the substrate body, and having a second subsurface which is a portion of the second surface of the flexible surface corresponding to the bent portion.
wherein the second subsurface is supported by the supporting portion of the protective part such that a radius of curvature of the bent portion of the flexible substrate is not less than a minimal radius of curvature which the flexible substrate is capable of withstanding when it is bent,
wherein the protective part is a protective film comprising:
a first surface;
a second surface opposite to the first surface of the protective film;
a protective film body covering at least a portion of the first subsurface of the substrate body of the flexible substrate, wherein the protective film body has: a first subsurface which is a portion of the first surface of the protective film corresponding to the protective film body, and which faces towards the substrate body of the flexible substrate; and a second subsurface which is a portion of the second surface of the protective film corresponding to the protective film body; and a first back folded segment disposed on at least one side of the protective film body, wherein the first back folded segment is connected to the protective film body and is folded back towards the first subsurface of the substrate body of the flexible substrate so as to form the supporting portion, and the first back folded segment has a third subsurface which is a portion of the second surface of the protective film corresponding to the first back folded segment; and wherein the display module further comprises a layer disposed on the second subsurface of the protective film body; and wherein the third subsurface of the first back folded segment faces towards a surface of the layer facing away from the protective film body of the protective film.

12. The display module of claim 11, wherein:
the third subsurface of the first back folded segment fits in with the surface of the layer facing away from the protective film body of the protective film.

13. The display module of claim 11, wherein:
the layer comprises:
a second heat dissipation layer disposed on the second subsurface of the protective film body; and
a third adhesion layer disposed on a surface of the second heat dissipation layer facing away from the protective film body.

14. The display module of claim 11, wherein:
the protective film comprises:
a first adhesion layer covering at least a portion of the first subsurface of the substrate body of the flexible substrate; and
a buffer layer disposed on a surface of the first adhesion layer facing away from the substrate body.

15. The display module of claim 14, wherein:
the protective film further comprises:
a first heat dissipation layer disposed on a surface of the buffer layer facing away from the substrate body; and
a second adhesion layer disposed on a surface of the first heat dissipation layer facing away from the buffer layer.

16. An electronic apparatus comprising: the display module of claim 11.

17. A display module comprising:
a flexible substrate having a first surface configured to form a displaying structure, and a second surface opposite to the first surface; and
a protective part located on the second surface of the flexible substrate and having a supporting portion,
wherein the flexible substrate comprises:
a substrate body having a first subsurface which is a portion of the second surface of the flexible substrate corresponding to the substrate body; and
a bent portion located at at least one side of the substrate body, bent towards the first subsurface of the substrate body, and having a second subsurface which is a portion of the second surface of the flexible substrate corresponding to the bent portion,
wherein the second subsurface is supported by the supporting portion of the protective part such that a radius of curvature of the bent portion of the flexible substrate is not less than a minimal raduis of curvature which the flexible substrate is capable of withstanding when it is bent, wherein the protective part is a protective film comprising:
a first surface;
a second surface opposite to the first surface of the protective film;
a protective film body covering at least a portion of the first subsurface of the substrate body of the flexible substrate, wherein the protective film body has: a first subsurface which is a portion of the first surface of the protective film corresponding to the protective film body, and which faces towards the substrate body of the flexible substrate; and a second subsurface which is a portion of the second surface of the protective film corresponding to the protective film body; and
second and third back folded segments disposed on at least one side of the protective film body, wherein the second back folded segment is connected between the protective film body and the third back folded segment, and the second back folded segment and the third back folded segment are folded back towards the first subsurface of the substrate body of the flexible substrate so as to form the supporting portion, the second back folded segment has a third subsurface which is a portion of the second surface of the protective film corresponding to the second back folded segment, the third back folded segment has: a fourth subsurface which is a portion of the first surface of the protective film corresponding to the third back folded segment; and a fifth subsurface which is a portion of the second surface of the protective film corresponding to the third back folded segment,
wherein the display module further comprises a layer disposed on the second subsurface of the protective film body; and
wherein the fifth subsurface of the third back folded segment faces towards the third subsurface of the second back folded segment, and the fourth subsurface of the third back folded segment faces towards a surface of the layer facing away from the protective film body of the protective film.

18. The display module of claim 17, wherein:
the fifth subsurface of the third back folded segment fits in with the third subsurface of the second back folded segment, and the fourt h subsurface of the third back folded segment fits in with the surface of the layer facing away from the protective film body of the protective film.

19. The display module of claim 17, wherein:
the protective film comprises:
a first adhesion layer covering at least a portion of the first subsurface of the substrate body of the flexible substrate; and
a buffer layer disposed on a surface of the first adhesion layer facing away from the substrate body.

20. An electronic apparatus comprising: the display module of claim 17.

* * * * *